(12) United States Patent
Lee et al.

(10) Patent No.: US 10,644,658 B2
(45) Date of Patent: May 5, 2020

(54) APPARATUS AND METHOD FOR TRANSMITTING SIGNAL IN WIRELESS COMMUNICATION SYSTEM

(71) Applicant: Samsung Electronics Co., Ltd, Suwon-si (KR)

(72) Inventors: Munwoo Lee, Suwon-si (KR); Youngyoon Woo, Hwaseong-si (KR); Martynovich Pavel, Suwon-si (KR); Jaebum Kim, Seoul (KR); Donggeun Lee, Hwaseong-si (KR); Sungchul Hong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/090,126

(22) PCT Filed: Mar. 24, 2017

(86) PCT No.: PCT/KR2017/003158
§ 371 (c)(1),
(2) Date: Sep. 28, 2018

(87) PCT Pub. No.: WO2017/171310
PCT Pub. Date: Oct. 5, 2017

(65) Prior Publication Data
US 2019/0115878 A1    Apr. 18, 2019

(30) Foreign Application Priority Data
Mar. 28, 2016  (KR) .................. 10-2016-0036814

(51) Int. Cl.
*H03F 1/32*  (2006.01)
*H03F 3/24*  (2006.01)
(Continued)

(52) U.S. Cl.
CPC ......... *H03F 1/3258* (2013.01); *H03F 1/3247* (2013.01); *H03F 3/24* (2013.01);
(Continued)

(58) Field of Classification Search
CPC ........ H03F 1/32; H03F 1/3241; H03F 1/3247; H03F 1/3258; H03F 3/20; H03F 3/24;
(Continued)

(56) References Cited

U.S. PATENT DOCUMENTS 6,351,540 B1   2/2002  Suzuki et al.
7,561,636 B2   7/2009  Song et al.
(Continued)

FOREIGN PATENT DOCUMENTS

KR   10-2000-0023416 A   4/2000
KR   10-2004-0030817 A   4/2004
(Continued)

OTHER PUBLICATIONS

International Search Report dated May 23, 2017 in connection with International Patent Application No. PCT/KR2017/003158.
(Continued)

*Primary Examiner* — Young T Tse

(57) ABSTRACT

The present disclosure relates to an apparatus and a method for transmitting a signal using a power amplifier in a wireless communication system in which a transceiver comprises a digital pre-distorter configured to distort an input signal based on a distortion control value, a power amplifier configured to amplify an output signal from the digital pre-distorter, an antenna configured to transmit an output signal from the power amplifier, an echo signal canceller configured to remove an echo signal which returns to the power amplifier due to a return loss of a path between the power amplifier and the antenna, from a feedback signal obtained at an output stage of the power amplifier, and a
(Continued)

digital pre-distortion adaptation unit configured to determine the distortion control value based on an output signal from the echo signal canceller.

18 Claims, 4 Drawing Sheets

(51) Int. Cl.
*H04B 1/04* (2006.01)
*H04B 17/10* (2015.01)
*H04B 3/23* (2006.01)
*H04W 88/08* (2009.01)

(52) U.S. Cl.
CPC ............. *H04B 1/04* (2013.01); *H04B 1/0475* (2013.01); *H04B 1/0483* (2013.01); *H04B 3/231* (2013.01); *H04B 17/103* (2015.01); *H04W 88/085* (2013.01); *H04B 2001/0408* (2013.01); *H04B 2001/0425* (2013.01); *H04B 2001/0433* (2013.01); *H04B 2001/0441* (2013.01)

(58) Field of Classification Search
CPC .......... H04B 1/02; H04B 1/04; H04B 1/0475; H04B 1/0483; H04B 3/23; H04B 3/231; H04B 3/235; H04B 3/238; H04B 2001/0408; H04B 2001/0425; H04B 2001/0433; H04B 2001/0441; H04B 17/103; H04W 88/085
USPC ........ 375/219, 296, 297; 370/286, 289–291; 379/406.01, 406.05, 408.08; 381/71.1, 381/94.1; 455/114.3
See application file for complete search history.

(56) References Cited

U.S. PATENT DOCUMENTS

| | | | |
|---|---|---|---|
| 8,489,041 B2 | 7/2013 | Teillet et al. | |
| 8,648,659 B2 | 2/2014 | Oh et al. | |
| 8,903,015 B2 | 12/2014 | Haddad | |
| 9,813,190 B1* | 11/2017 | Sutskover | H04L 1/0042 |
| 10,305,435 B1* | 5/2019 | Murugesu | H03F 1/3258 |
| 2003/0031315 A1 | 2/2003 | Belt et al. | |
| 2010/0283540 A1* | 11/2010 | Davies | H03F 1/3247 |
| | | | 330/149 |
| 2011/0033059 A1* | 2/2011 | Bhaskar | H04M 9/082 |
| | | | 381/71.4 |
| 2014/0050282 A1* | 2/2014 | Watanabe | H03F 1/3247 |
| | | | 375/296 |
| 2015/0080054 A1* | 3/2015 | Kim | H03F 1/3247 |
| | | | 455/561 |
| 2015/0092622 A1* | 4/2015 | Sturkovich | H04B 1/525 |
| | | | 370/278 |

FOREIGN PATENT DOCUMENTS

| | | |
|---|---|---|
| KR | 10-2009-0062907 A | 6/2009 |
| KR | 10-2012-0057603 A | 6/2012 |
| KR | 10-2012-0070144 A | 6/2012 |

OTHER PUBLICATIONS

Written Opinion of the International Searching Authority dated May 23, 2017 in connection with International Patent No. PCT/KR2017/003158.

* cited by examiner

APPARATUS AND METHOD FOR TRANSMITTING SIGNAL IN WIRELESS COMMUNICATION SYSTEM

CROSS-REFERENCE TO RELATED APPLICATIONS

This application is a 371 of International Application No. PCT/KR2017/003158 filed on Mar. 24, 2017, which claims priority to Korean Patent Application No. 10-2016-0036814 filed on Mar. 28, 2016, the disclosures of which are herein incorporated by reference in their entirety.

BACKGROUND

1. Field

The present disclosure relates to an apparatus and a method for transmitting a signal using a power amplifier in a wireless communication system.

2. Description of Related Art

Recently, a distributed base station architecture is studied and developed in a wireless communication system. The distributed base station architecture is configured by separating a remote radio units (RRUs) (or radio frequency (RF) transceivers) from a base station and relocating them close to antennas so that a plurality of antennas operates with a minimum transmission power loss. That is, in the distributed base station architecture, a plurality of RRUs is distributed within one cell, wherein the plurality of the RRUs is installed at a considerable distance from a main unit of the base station and is connected by optic cables. The RRU includes a transceiver, a power amplifier, and a front-end unit.

A digital pre-distorter (DPD) is used to improve nonlinearity of the power amplifier in the wireless communication system. In other words, in the wireless communication system, a signal is distorted according to characteristics of the power amplifier using the DPD, and then the nonlinearity of the power amplifier is improved by using the distorted signal as an input of the power amplifier.

However, if a connection state between an output of the RRU and the antenna is not good, a high return loss occurs. Due to such a high return loss, the DPD may not generate the distorted signal which accurately reflects the characteristic of the power amplifier.

SUMMARY

An embodiment provides an apparatus and a method for improving nonlinearity of a power amplifier in a wireless communication system.

Another embodiment provides an apparatus and a method for reflecting a characteristic of a power amplifier at a digital pre-distorter (DPD), by removing an echo signal due to a return loss from an output signal of the power amplifier in a wireless communication system.

A transceiver in a wireless communication system according to an embodiment may include a digital pre-distorter for distorting an input signal based on a distortion control value, a power amplifier for amplifying a signal outputted from the digital pre-distorter, an antenna for transmitting a signal outputted from the power amplifier, an echo signal canceller for removing an echo signal which returns to the power amplifier due to a return loss of a path between the power amplifier and the antenna, from a feedback signal obtained at an output stage of the power amplifier, and a digital pre-distortion adaptation unit for determining the distortion control value based on a signal outputted from the echo signal canceller.

A method of a transceiver in a wireless communication system may include distorting an input signal based on a distortion control value, amplifying the distorted signal using a power amplifier, transmitting a signal outputted from the power amplifier using an antenna, removing an echo signal which returns to the power amplifier due to a return loss of a path between the power amplifier and the antenna, from a feedback signal obtained at an output stage of the power amplifier, and determining the distortion control value based on a signal in which the echo signal removed.

By removing an echo signal due to a return loss from an output signal of a power amplifier in a wireless communication system, even if a high return loss occurs due to a connection state between an output of a remote radio unit (RRU) and an antenna, a digital pre-distorter (DPD) may improve nonlinearity of a power amplifier by accurately reflecting the characteristic of the power amplifier.

DETAILED DESCRIPTION

Hereinafter, an operational principle of various embodiments is described in detail with reference to the accompanying drawings. In the following various embodiments, well-known functions or constitutions will not be described in detail if they would unnecessarily obscure the subject matter of the invention. Also, terminologies to be described below are defined in consideration of functions in the various embodiments and may vary depending on a user's or an operator's intention or practice. Thus, their definitions should be defined based on all the contents of the specification.

Hereafter, the present disclosure provides a technique for improving nonlinearity of a power amplifier in a wireless communication system.

Terms indicating signals, terms indicating state changes (e.g., event), and terms indicating components of a device, used in the following, are mentioned for the sake of explanations. Accordingly, the present invention is not limited to the terms to be described, and may use other terms having technically identical meaning.

For the sake of explanations, some of terms and names defined in a $3^{rd}$ generation partnership project (3GPP) long term evolution (LTE) standard or institute of electrical and electronically engineers (IEEE) 802.11 standard may be used. However, the present invention is not limited by those terms and names, and may be identically applied to systems confirming to other standards.

Also, the following embodiment is explained on assumption that the apparatus for improving the nonlinearity of the power amplifier is included in a remote radio unit (RRU). However, the following embodiment is not limited to the RRU. For example, the following embodiment may be applied to a transceiver including a power amplifier, or to a transmitter including a power amplifier in the same manner.

Figure 1:
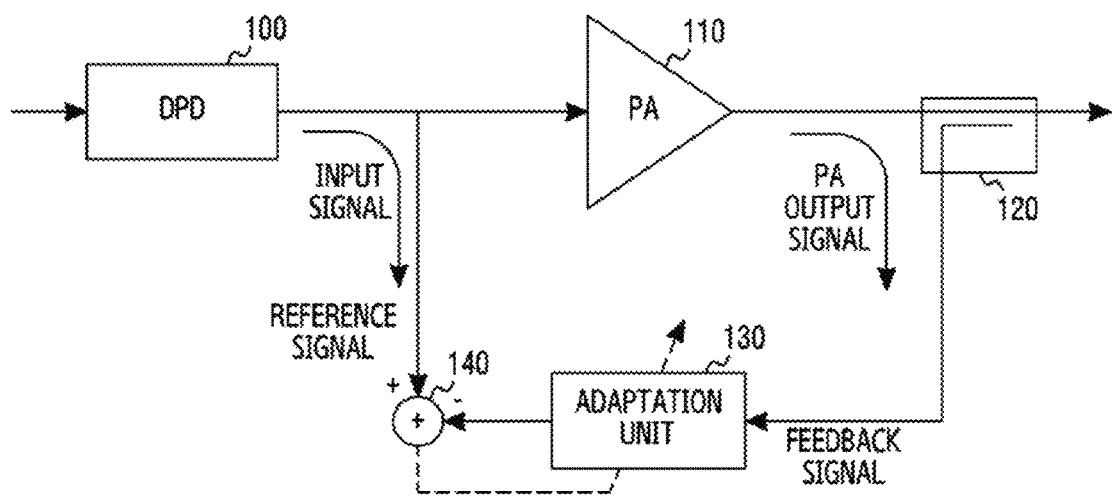
FIG. 1 illustrates an apparatus for improving nonlinearity of a power amplifier in a wireless communication system.

FIG. 1 illustrates an apparatus for improving nonlinearity of a power amplifier in a wireless communication system. A term such as 'portion' or '~er' used in the following indicates a unit for processing at least one function or operation, and may be implemented using hardware, software, or a combination of hardware and software. In addition, the apparatus for improving the nonlinearity of the power amplifier may be included in an RRU.

Referring to FIG. 1, the apparatus for improving the nonlinearity of the power amplifier includes a digital pre-distorter (DPD) 100, a power amplifier (PA) 110, a coupler 120, a digital pre-distortion adaptation unit 130, and an adder 140.

The DPD 100 is connected to the PA 110, and provides an input signal to the PA 110. To linearize an output of the PA 110, the DPD 100 distorts the input signal based on a characteristic of the PA 110 and provides the distorted signal to the PA 110. That is, the DPD 100 receives a distortion control signal for distorting a signal from the digital pre-distortion adaptation unit 130, and distorts and outputs the input signal based on the distortion control value. Herein, the DPD 100 distorts and outputs the input signal, thus enabling the PA 110 to output a linear signal.

The PA 110 receives the distorted input signal from the DPD 100, and amplifies and outputs the input signal. Herein, the PA 110 nonlinearly amplifies and outputs a linear input signal. However, since the PA 110 receives the distorted signal which considers the nonlinearity of the PA 110 from the DPD 100 in the present disclosure, it may output the linearly amplified signal.

The coupler 120 couples and provides the output signal of the PA 110 to the digital pre-distortion adaptation unit 130.

The digital pre-distortion adaptation unit 130 performs modeling on the signal inputted from the coupler 120 based on a signal provided from the adder 140, to thus make the output signal of the digital pre-distortion adaptation unit 130 the same as the input signal of the PA 110. That is, the digital pre-distortion adaptation unit 130 searches for an optimal polynomial coefficient which makes a difference of the output signal of the digital pre-distortion adaptation unit 130 and the input signal of the PA 110 zero. In other words, the digital pre-distortion adaptation unit 130 may search for the optimal polynomial coefficient which makes the signal provided from the adder 140 have a value closest to zero. Based on the obtained optimal polynomial coefficient, the digital pre-distortion adaptation unit 130 may model and output the signal provided from the adder 140 similarly to the input signal of the PA 110. Also, the digital pre-distortion adaptation unit 130 searches for a polynomial coefficient which makes the signal provided from the adder 140 zero, changes the obtained polynomial coefficient with the distortion control value, and provides the distortion control value to the DPD 100.

The adder 140 receives the output signal of the DPD 100, that is, the input signal of the PA 110 as a reference signal, subtracts the output signal of the digital pre-distortion adaptation unit 130 from the reference signal, and provides a subtracted result to the digital pre-distortion adaptation unit 130.

As described above, the digital pre-distortion adaptation unit 130 uses the output signal of the PA 110 as a feedback signal in the wireless communication system according to an embodiment of the present disclosure. However, if a connection state between the output of the RRU including the apparatus for improving the nonlinearity of the PA 110 of FIG. 1 and an antenna (not shown) is not good, an echo signal may occur due to a high return loss and such an echo signal may be applied as the feedback signal together with the output signal of the PA 110. Thus, in the following, an embodiment of the present disclosure will describe an apparatus and a method for improving the nonlinearity of the PA in an environment where the echo signal occurs.

Figure 2:
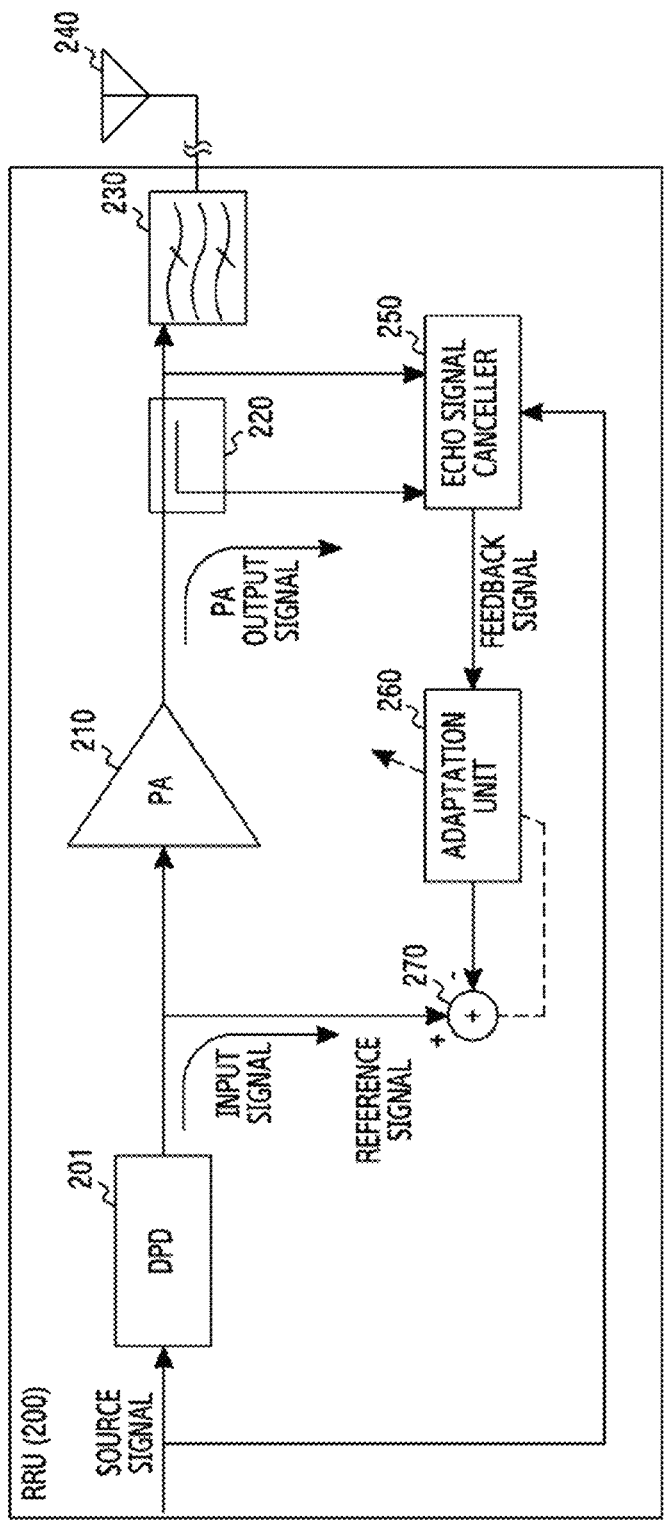
FIG. 2 illustrates a configuration of a remote radio unit (RRU) in a wireless communication system according to an embodiment of the present disclosure.

FIG. 2 illustrates a configuration of an RRU in a wireless communication system according to an embodiment of the present disclosure. A term such as 'portion' or '~er' used in the following indicates a unit for processing at least one function or operation, and may be implemented using hardware, software, or a combination of hardware and software. Herein, only device components for improving the nonlinearity of the PA are illustrated, and other device components are omitted. Thus, the RRU may further include other components than the components shown. For example, it may further include components such as a digital-to-analog converter and a mixer.

Referring to FIG. 2, the RRU 200 includes a DPD 201, a PA 210, a coupler 220, a filter 230, an echo signal canceller 250, a digital pre-distortion adaptation unit 260, and an adder 270.

The DPD 201 is connected to the PA 210 and provides an input signal to the PA 210. The DPD 201 distorts an inputted source signal based on a characteristic of the PA 210 and provides a distorted signal to the PA 210. That is, the DPD 201 receives a distortion control value for distorting a signal from the digital pre-distortion adaptation unit 260. The DPD 201 distorts and outputs the inputted source signal based on the received distortion control value. For example, the DPD 201 may include a lookup table including distortion control values. The lookup table may store the distortion control values corresponding to sizes of all input signals which may be inputted to the PA 210. The DPD 201 may determine an address of the lookup table based on the size of the source signal, obtain a distortion control value corresponding to the determined address in the lookup table, and then distort a corresponding source signal with the obtained distortion control value. Herein, the DPD 201 distorts and outputs the inputted source signal, in order to enable the PA 210 to output a linear signal. While the embodiment of the present invention describes that the source signal is distorted and outputted using the lookup table including the distortion control values, this is an example for ease the understanding of the present invention and the present invention is not limited thereto. For example, various embodiments of the present invention may be equally applied to a case where the source signal is distorted using other method than the method for distorting the source signal using the lookup table including distortion control values.

The PA 210 receives the distorted input signal from the DPD 201, and amplifies and outputs the input signal. Herein, the PA 210 nonlinearly amplifies and outputs the linear input signal. However, since the PA 210 receives the distorted signal which considers the nonlinearity of the PA 210 from the DPD 201 in the present disclosure, it may output the linearly amplified signal.

The coupler 220 is positioned between an output stage of the PA 210 and the filter 230. By coupling the output signal of the PA 210, the coupler 220 provides the output signal to the filter 230, and extracts and provides some signal from the output signal to the echo signal canceller 250.

The filter 230 passes a signal in a particular frequency band from the signal provided from the coupler 220. An output signal of the filter 230 is provided to the antenna 240.

Herein, if the connection state between the output of the filter 230 and the antenna 240 is not good, an echo signal which passes through the filter 230 and returns to the coupler 220 may occur at a point where the antenna connection state is not good due to a high reflection loss. The echo signal may be provided to the echo signal canceller 250 together with the output signal of the PA 210. Herein, the echo signal may include characteristics such as a coupler, a filter, and a cable positioned between the PA 210 and the antenna 240.

The echo signal canceller 250 cancels the echo signal in the feedback signal provided by the coupler 220, based on the feedback signal provided by the coupler 220, the source signal inputted to the DPD 201, and an observation signal which reflects a characteristic of the echo signal. Herein, the feedback signal includes the output signal of the PA 210 and the echo signal. In addition, the observation signal may include the characteristic of the echo signal inputted from the filter 230 to the coupler 220. Specifically, the echo signal canceller 250 performs first modeling on the observation signal and the source signal, and delays a first modeling result. The echo signal canceller 250 may perform second modeling on a difference between the feedback signal and the source signal and the modeling result, subtracts a second modeling result from the feedback signal, and thus obtain the feedback signal with the echo signal canceled, that is, the output signal of the PA 210. The echo signal canceller 250 provides a final feedback signal with the echo signal removed, to the digital pre-distortion adaptation unit 260. Herein, the operations of the echo signal canceller 250 will be described in more detail in FIG. 3.

The digital pre-distortion adaptation unit 260 performs modeling on the feedback signal from which echo signal is removed from the echo signal canceller 250 based on the signal provided from the adder 270, to thus make the output signal of the digital pre-distortion adaptation unit 260 the same as the input signal of the PA 210. That is, the digital pre-distortion adaptation unit 260 searches for an optimal polynomial coefficient which makes a difference of the output signal of the digital pre-distortion adaptation unit 260 and the input signal of the PA 210 zero. In other words, the digital pre-distortion adaptation unit 260 may search for the optimal polynomial coefficient which makes the signal provided from the adder 270 have a value closest to zero. Based on the obtained optimal polynomial coefficient, the digital pre-distortion adaptation unit 260 may model and output the signal provided from the adder 270 similarly to the input signal of the PA 210. Also, the digital pre-distortion adaptation unit 260 searches for a polynomial coefficient which makes the signal provided from the adder 270 zero, changes the obtained polynomial coefficient with a distortion control value, and provides the distortion control value to the DPD 201.

The adder 270 receives the output signal of the DPD 201, that is, the input signal of the PA 210 as a reference signal, subtracts the output signal of the digital pre-distortion adaptation unit 260 from the reference signal, and provides a subtracted result to the digital pre-distortion adaptation unit 260.

Figure 3:
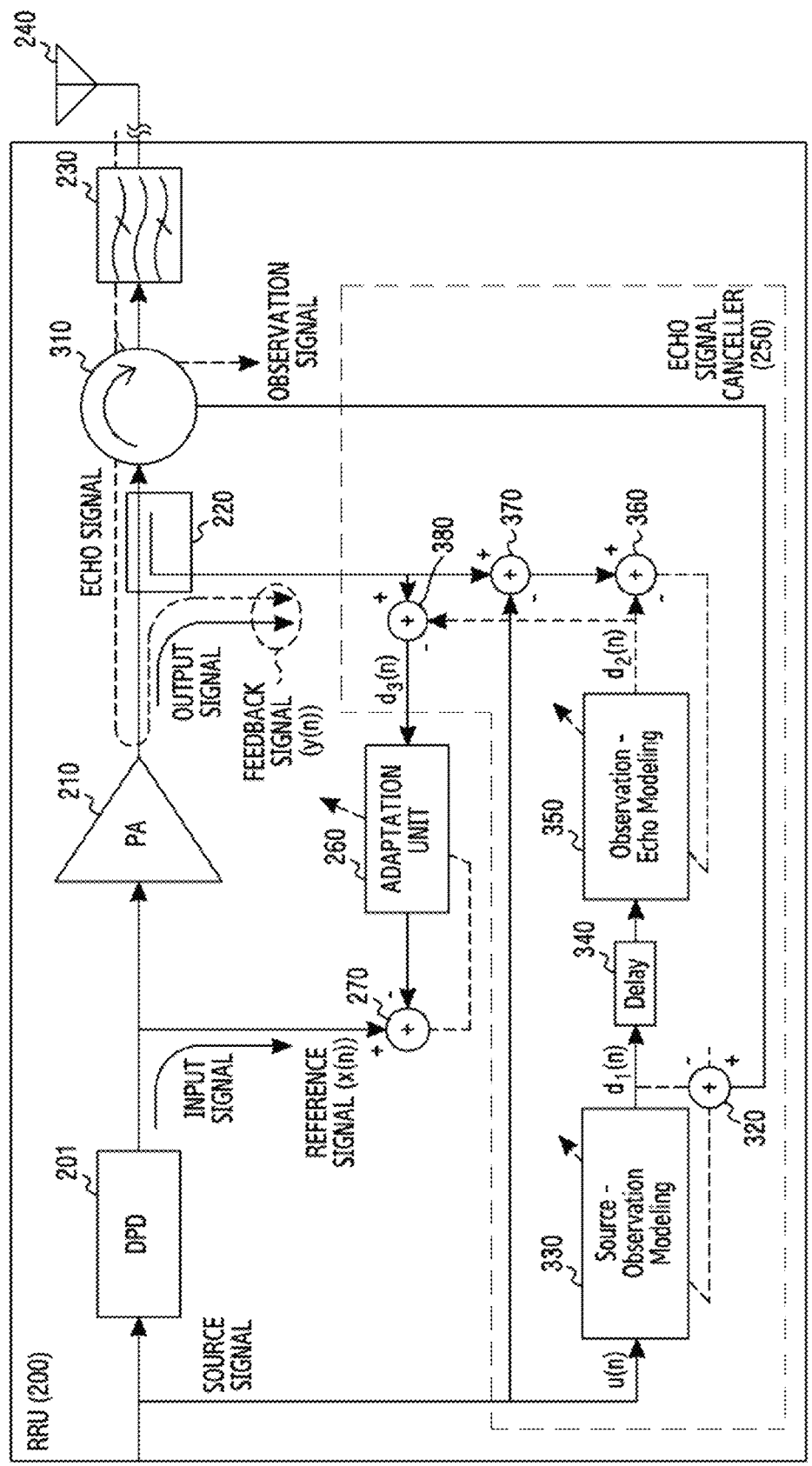
FIG. 3 illustrates a detailed configuration of an echo signal canceller of FIG. 2 according to an embodiment of the present disclosure.

FIG. 3 illustrates a detailed configuration of an echo signal canceller of FIG. 2 according to an embodiment of the present disclosure. A term such as 'portion' or '~er' used in the following indicates a unit for processing at least one function or operation, and may be implemented using hardware, software, or a combination of hardware and software.

Referring to FIG. 3, the RRU 200 includes a DPD 201, a PA 210, a coupler 220, a filter 230, an echo signal canceller 250, a digital pre-distortion adaptation unit 260, an adder 270, and a circulator 310. Also, the echo signal canceller 250 may include a first adder 320, a source-observation modeling unit 330, a delayer 340, an observation-echo modeling unit 350, a second adder 360, a third adder 370, and a fourth adder 380.

The DPD 201 is connected to the PA 210 and provides an input signal to the PA 210. The DPD 201 distorts an inputted source signal based on a characteristic of the PA 210 and provides a distorted signal to the PA 210. That is, the DPD 201 receives a distortion control value for distorting a signal from the digital pre-distortion adaptation unit 260. The DPD 201 distorts and outputs the inputted source signal based on the received distortion control value. For example, the DPD 201 may include a lookup table including distortion control values. The lookup table may store the distortion control values corresponding to sizes of all input signals which may be inputted to the PA 210. The DPD 201 may determine an address of the lookup table based on the size of the source signal, obtain a distortion control value corresponding to the determined address in the lookup table, and then distort a corresponding source signal with the obtained distortion control value. Herein, the DPD 201 distorts and outputs the input source signal, in order to enable the PA 210 to output a linear signal. While the embodiment of the present invention describes that the source signal is distorted and outputted using the lookup table including the distortion control values, this is an example for facilitating the understanding of the present invention and the present invention is not limited thereto. For example, various embodiments of the present invention may be equally applied to a case where the source signal is distorted using other method than the method for distorting the source signal using the lookup table including distortion control values.

The PA 210 receives the distorted input signal from the DPD 201, and amplifies and outputs the input signal. Herein, the PA 210 nonlinearly amplifies and outputs the linear input signal. However, since the PA 210 receives the distorted signal which considers the nonlinearity of the PA 210 from the DPD 201 in the present disclosure, it may output the linearly amplified signal.

The coupler 220 is positioned between an output stage of the PA 210 and the filter 230. By coupling the output signal of the PA 210, the coupler 220 provides the output signal to the filter 230, and extracts and provides some signal from the output signal to the echo signal canceller 250.

The filter 230 passes a signal of a particular frequency band in the signal provided from the coupler 220. An output signal of the filter 230 is provided to the antenna 240. Herein, if a connection state between the output of the filter 230 and the antenna 240 is not good, an echo signal which passes through the filter 230 and returns to the coupler 220 may occur at a point where the antenna connection state is not good due to a high reflection loss. The echo signal may be provided to the echo signal canceller 250 together with the output signal of the PA 210. Herein, the echo signal may include characteristics such as a coupler, a filter, and a cable positioned between the PA 210 and the antenna 240. The circulator 310 is positioned between the coupler 220 and the filter 230, provides the output signal from the coupler 220 to the filter 230, and provides part of the echo signal outputted from the filter 230 toward the coupler 220, to the first adder 320 of the echo signal canceller 250. Herein, the signal provided from the circulator 310 to the first adder 320 is referred to as an observation signal. The observation signal may include the characteristic of the echo signal which is inputted from the filter 230 to the coupler 220.

The echo signal canceller 250 cancels the echo signal in a feedback signal provided by the coupler 220, based on the feedback signal provided by the coupler 220, the source signal inputted to the DPD 201, and the observation signal which reflects the characteristic of the echo signal.

More specifically, the first adder 320 of the echo signal canceller 250 subtracts an output signal $d_1(n)$ from the source-observation modeling unit 330, from the observation signal provided from the circulator 310. The first adder 320 provides a result of subtracting $d_1(n)$ from the observation signal, to the source-observation modeling unit 330.

The source-observation modeling unit 330 performs modeling on the source signal based on the signal provided from the first adder 320, in order to make the output signal $d_1(n)$ of the source-observation modeling unit 330 and the observation signal the same. The source-observation modeling unit 330 searches for an optimal polynomial coefficient which makes a difference of the output signal of the source-observation modeling unit 330 and the observation signal zero, based on Equation 1. In other words, the source-observation modeling unit 330 may search for the optimal polynomial coefficient which makes the signal provided from the first adder 320 have a value closest to zero. Based on the obtained optimal polynomial coefficient, the source-observation modeling unit 330 may model and output the source signal similarly to the observation signal.

$$d_1(n) = \sum_m^M \sum_p^P c_{m,p} \cdot u(n-m) \cdot |u(n-m)|^P \quad (1)$$

Herein, $d_1(n)$ denotes the output signal of the source-observation modeling unit 330. Also, m denotes a memory order, and M denotes a maximum value of the memory order m. The maximum value may have a value greater than a delay of the source signal and the observation signal. Also, P denotes a polynomial order, c denotes a complex number, and u(n) denotes the source signal.

The delayer 340 delays the output signal of the source-observation modeling unit 330 by a preset delay value. In so doing, the delay value of the delayer 340 may be determined and changed based on a correlation between the output signal $d_1(n)$ of the source-observation modeling unit 330 and a first signal outputted from the third adder 370 to the second adder 360. Herein, the first signal outputted from the third adder 370 to the second adder 360 indicates a resultant signal of subtracting the source signal from the feedback signal.

The observation-echo modeling unit 350 may perform modeling on the output signal from the delayer 340 based on the signal provided from the second adder 360, in order to make the output signal $d_2(n)$ of the source-observation modeling unit 330 and the first signal the same. The observation-echo modeling unit 350 searches for an optimal polynomial coefficient which makes a difference of the output signal of the observation-echo modeling unit 350 and the first signal zero, based on Equation 2. In other words, the observation-echo modeling unit 350 may search for the optimal polynomial coefficient which makes the signal provided from the second adder 360 have a value closest to zero. Based on the obtained optimal polynomial coefficient, the observation-echo modeling unit 350 may model and output the output signal from the delayer 340 similarly to the first signal. That is, the observation-echo modeling unit 350 may output the signal which is similar to the echo signal.

$$d_2(n) = \sum_m^{M_1} b_m \cdot d_1(n-m) \quad (2)$$

Herein, $d_2(n)$ denotes the output signal of the observation-echo modeling unit 350. Also, m denotes the memory order, and $M_1$ denotes the maximum value of the memory order m. Herein, $M_1$ may be the same as or different from M of Equation 1. Also, b denotes the polynomial coefficient, and $b_m$ may denote the number of coefficients which vary according to the memory order.

The second adder 360 subtracts the signal of the observation-echo modeling unit 350 from the first signal provided from the third adder 370, and provides a subtracted result signal to the observation-echo modeling unit 350.

The third adder 370 subtracts the source signal from the feedback signal provided from the coupler 220, and provides a subtracted result signal, that is, the first signal to the second adder 360. Herein, the feedback signal includes the output signal of the PA 210 and the echo signal.

The fourth adder 380 subtracts the output signal of the observation-echo modeling unit 350 from the feedback signal provided from the coupler 220 based on Equation 3, and provides a subtracted result signal to the digital pre-distortion adaptation unit 260. Herein, since the feedback signal includes the output signal of the PA 210 and the echo signal and the output signal of the observation-echo modeling unit 350 is similar to the echo signal, the subtracted result signal may be similar to the output signal of the PA 210. That is, the fourth adder 380 may obtain the output signal of the PA 210 by subtracting the echo signal from the feedback signal, and provide the obtained output signal of the PA 210 to the digital pre-distortion adaptation unit 260.

$$d_3(n) = y(n) - d_2(n) \quad (3)$$

Herein, $d_3(n)$ denotes the output signal of the fourth adder 380, and y(n) denotes the feedback signal including the output signal of the PA 210 and the echo signal. Also, $d_2(n)$ denotes the output signal of the observation-echo modeling unit 350.

The digital pre-distortion adaptation unit 260 may receive the feedback signal with the echo signal removed, that is, the output signal of the PA 210 from the adder 380 in the echo signal canceller 250. The digital pre-distortion adaptation unit 260 performs modeling on the feedback signal from which the echo signal is removed based on the signal provided from the adder 270, to thus make the output signal of the digital pre-distortion adaptation unit 260 the same as the input signal of the PA 210. That is, the digital pre-distortion adaptation unit 260 searches for an optimal polynomial coefficient which makes a difference of the output signal of the digital pre-distortion adaptation unit 260 and the input signal of the PA 210 zero. In other words, the digital pre-distortion adaptation unit 260 may search for the optimal polynomial coefficient which makes the signal provided from the adder 270 have a value closest to zero. Based on the obtained optimal polynomial coefficient, the digital pre-distortion adaptation unit 260 may model and output the signal provided from the adder 270 similarly to the input signal of the PA 210. Also, the digital pre-distortion adaptation unit 260 searches for a polynomial coefficient which makes the signal provided from the adder 270 zero, changes the obtained polynomial coefficient with a distortion control value, and provides the distortion control value to the DPD 201.

The adder 270 receives the output signal of the DPD 201, that is, the input signal of the PA 210 as a reference signal, subtracts the output signal of the digital pre-distortion adaptation unit 260 from the reference signal, and then provides a subtracted result to the digital pre-distortion adaptation unit 260.

Figure 4:
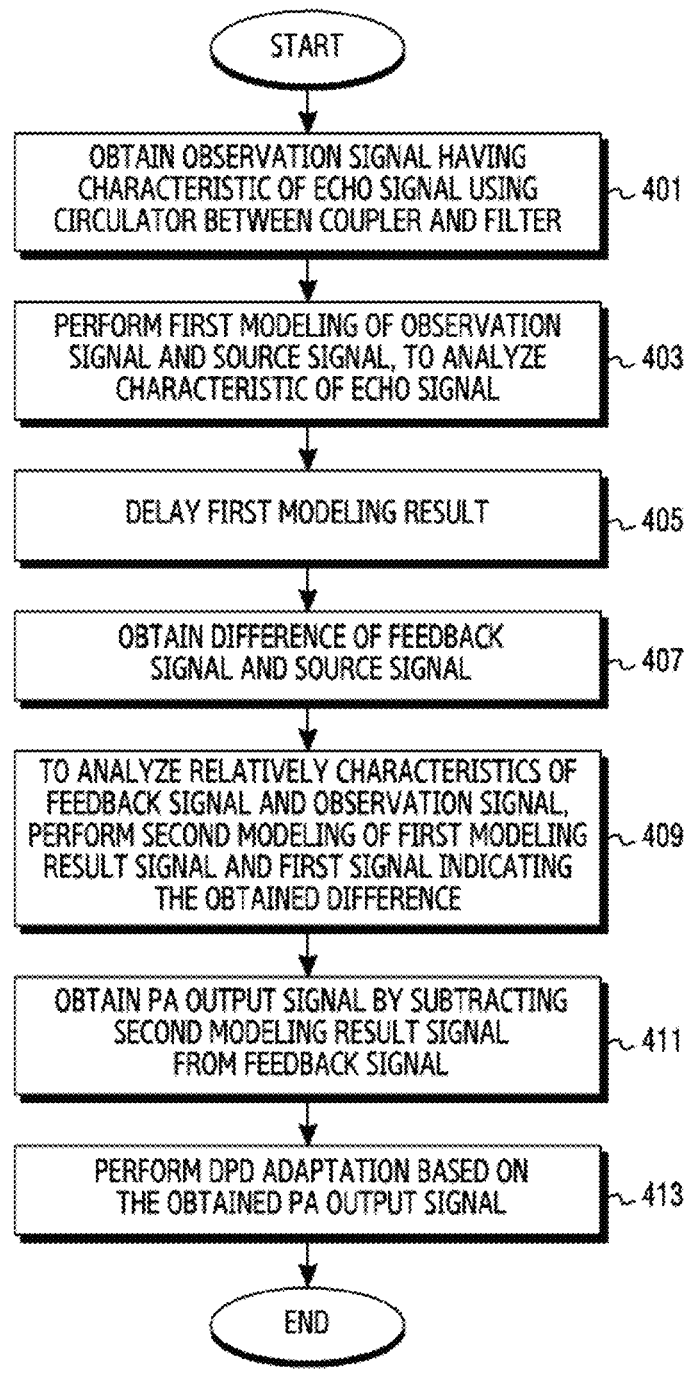
FIG. 4 illustrates an operating procedure of an RRU according to an embodiment of the present disclosure.

FIG. 4 illustrates an operating procedure of an RRU according to an embodiment of the present disclosure. In the following embodiment, steps are not necessarily performed in sequence. For example, the order of the steps may be changed, and at least two steps may be performed in parallel.

Referring to FIG. 4, the RRU 200 obtains an observation signal having a characteristic of an echo signal using the circulator 310 between the coupler 220 and the filter 230 in step 401. Herein, the echo signal indicates some signal which returns to the RRU 200, of a signal provided from the output stage of the RRU 200 to the antenna 240, due to a high return loss occurred by a connection state between the output of the RRU 200 and the antenna 240. The echo signal may be provided to the coupler 220 via the filter 230 which is disposed in the output stage of the RRU 200. Hence, the embodiment of the present disclosure may add the circulator 310 between the coupler 220 and the filter 230, and obtain the observation signal having the characteristic of the echo signal which is outputted from the filter 230 using the circulator 310.

To analyze the characteristic of the echo signal, the RRU 220 performs first modeling on the observation signal and the source signal in step 403. For example, based on Equation 1, the RRU 220 may perform the modeling to make a characteristic of the source signal the same as a characteristic of the observation signal. More specifically, the RRU 200 may perform the first modeling on the source signal while changing a polynomial coefficient, until a difference between a resultant signal of the first modeling on the source signal and the observation signal becomes zero. Herein, the source signal is a signal provided as the input of the DPD 201.

In step 405, the RRU 200 delays a first modeling result signal by a preset delay value. For example, to synchronize the signal indicating the difference of the feedback signal and the source signal with the observation signal, the RRU 200 may delay the first modeling result signal by the preset delay value. Herein, the delay value may be determined based on a correlation between the signal indicating the difference of the feedback signal and the source signal, and the first modeling result signal. Herein, the feedback signal indicates a signal obtained through the coupler 220, and may include the output signal of the PA 210 and the echo signal.

In step 407, the RRU 200 obtains the difference of the feedback signal and the source signal. For example, by subtracting the source signal from the feedback signal using the third adder 370, the RRU 200 may obtain a first signal indicating the difference of the feedback signal and the source signal.

To analyze relatively characteristics of the echo signal of the feedback signal and the observation signal, the RRU 200 performs second modeling on the first modeling result signal which is delayed by the preset delay value and the first signal indicating the difference of the feedback signal and the source signal in step 409. For example, based on Equation 2, the RRU 200 may perform the second modeling to make the characteristic of the delayed first modeling result signal the same as the characteristic of the first signal. More specifically, the RRU 200 may perform the second modeling on the delayed first modeling result signal while changing a polynomial coefficient, until a difference between a resultant signal of the second modeling on the delayed first modeling result signal and the first signal becomes zero.

In step 411, the RRU 200 obtains an output signal of the PA 210 by subtracting a second modeling result signal from the feedback signal. For example, the RRU 200 may obtain the output signal of the PA 210 by subtracting the second modeling result signal from the feedback signal which is provided from the coupler 220. Herein, since the feedback signal includes the output signal of the PA 210 and the echo signal and the second modeling result signal is similar to the echo signal, the output signal of the PA 210 may be obtained by subtracting the second modeling result signal from the feedback signal.

In step 413, the RRU 200 performs a digital pre-distortion adaptation function based on the obtained output signal of the PA 210. For example, the RRU 200 obtains a distortion control value for the source signal, based on a characteristic of the obtained output signal of the PA 210. By conducting the modeling on the output signal of the PA 210 using the digital pre-distortion adaptation unit 260, the RRU 200 makes an output signal of the digital pre-distortion adaptation unit 260 the same as the output signal of the PA 210. The digital pre-distortion adaptation unit 260 of the RRU 200 may search for an optimal polynomial coefficient which makes a difference of the output signal of the digital pre-distortion adaptation unit 260 and the input signal of the PA 210 zero, and model and output the output signal of the PA 210 similarly to the input signal of the PA 210, based on the obtained optimal polynomial coefficient. In addition, the RRU 200 may change the obtained polynomial coefficient with the distortion control value, distort the source signal using the changed distortion control value, and then provide it to the PA 210.

Next, the RRU 200 finishes the operating procedure according to an embodiment of the present disclosure. Also, in signal transmission, the RRU 200 may repeatedly perform the above-described operations of FIG. 4.

The methods according to embodiments described in the claims or the specification of the present disclosure may be implemented in software, firmware, hardware, or in their combinations.

Such software may be stored in a computer-readable storage medium. The computer-readable storage medium stores at least one program (software module), if executed by at least one processor in an electronic device, including instructions making the electronic device to execute the method of the present disclosure.

Such software may be stored in volatile or non-volatile storage devices such as a read only memory (ROM), memories such as a random access memory (RAM), a memory chip, a device, or an integrated circuit, or optical or magnetic readable media such as a compact disc (CD)-ROM, a digital versatile disc (DVD), a magnetic disk, or a magnetic tape.

A storage device and a storage medium are an example of machine-readable storage media which are suitable for storing a program including instructions to implement the embodiments, or programs. The embodiments provide a program including codes to implement an apparatus or a method according to any one of the claims of the present disclosure, and a machine-readable storage medium including the program. Further, such programs may be transferred electronically through a medium such as a communication signal transferred through a wired or wireless connection, and may appropriately include an equivalent medium.

In the specific embodiments of the present disclosure, the elements included in the invention are expressed in a singular or plural form. However, the singular or plural expression is appropriately selected according to a proposed situation for the convenience of explanation and the present disclosure is not limited to a single element or a plurality of elements. The elements expressed in the plural form may be configured as a single element and the elements expressed in the singular form may be configured as a plurality of elements.

Meanwhile, the detailed description of the present disclosure has explained specific embodiments thereof, but various modifications may be made without departing from the scope of this disclosure. Therefore, the scope of this disclosure should not be limited to the described embodiments but should be defined by the claims as below and their equivalents within the scope of the claims.

The invention claimed is:

1. A transceiver in a wireless communication system, comprising:
    a digital pre-distorter configured to distort an input signal based on a distortion control value;
    a power amplifier configured to amplify an output signal from the digital pre-distorter;
    an antenna configured to transmit an output signal from the power amplifier;
    an echo signal canceller configured to remove an echo signal which returns to the power amplifier due to a return loss of a path between the power amplifier and the antenna, from a feedback signal obtained at an output stage of the power amplifier; and
    a digital pre-distortion adaptation unit configured to determine the distortion control value based on an output signal from the echo signal canceller.

2. The transceiver of claim 1, further comprising:
    a coupler configured to:
    provide the output signal from the power amplifier to the antenna,
    obtain the feedback signal based on the output signal from the power amplifier, and
    provide the obtained feedback signal to the echo signal canceller.

3. The transceiver of claim 2, wherein the feedback signal is a signal extracted from the output signal from the power amplifier.

4. The transceiver of claim 3, further comprising:
    a circulator configured to obtain a first signal which comprises a characteristic of the echo signal; and
    a filter configured to provide an output signal from the coupler to the antenna,
    wherein the circulator is positioned between the coupler and the filter, and
    wherein the filter is positioned between the circulator and the antenna.

5. The transceiver of claim 4, wherein the echo signal canceller comprises:
    a first modeling unit configured to perform a first modeling on the input signal so as to output a same signal as the first signal; and
    a first adder configured to provide a difference between an output signal from the first modeling unit and the first signal to the first modeling unit.

6. The transceiver of claim 5, wherein the echo signal canceller further comprises:
    a delayer configured to delay the output signal from the first modeling unit by a delay value,
    wherein the delay value is determined by a correlation between a second signal indicating a difference of the feedback signal and the input signal, and the output signal from the first modeling unit.

7. The transceiver of claim 6, wherein the echo signal canceller further comprises:
    a second modeling unit configured to perform a second modeling on the delayed output signal so as to output a same signal as the second signal; and
    a second adder configured to provide a difference between an output signal from the second modeling unit and the second signal to the second modeling unit.

8. The transceiver of claim 7, wherein the echo signal canceller further comprises:
    a third adder configured to provide the second signal indicating the difference between the feedback signal and the input signal to the second adder.

9. The transceiver of claim 8, wherein the echo signal canceller further comprises:
    a fourth adder configured to provide a third signal indicating the difference between the feedback signal and the output signal from the second modeling unit to the digital pre-distortion adaptation unit,
    wherein the third signal is a signal with the echo signal cancelled from the feedback signal.

10. A method of a transceiver in a wireless communication system, the method comprising:
    distorting, by a digital pre-distorter, an input signal based on a distortion control value;
    amplifying, by a power amplifier, an output signal from the digital pre-distorter;
    transmitting, by an antenna, an output signal from the power amplifier;
    removing, by an echo signal canceller, an echo signal which returns to the power amplifier due to a return loss of a path between the power amplifier and the antenna, from a feedback signal obtained at an output stage of the power amplifier; and
    determining, by a digital pre-distortion adaptation unit, the distortion control value based on an output signal from the echo signal canceller.

11. The method of claim 10, further comprising:
    providing the output signal from the power amplifier to the antenna through a coupler;
    obtaining the feedback signal based on the output signal from the power amplifier; and
    providing the obtained feedback signal to the echo signal canceller.

12. The method of claim 11, wherein the feedback signal is a signal extracted from the output signal from the power amplifier.

13. The method of claim 12, wherein the removing the echo signal comprises:
    obtaining, by a circulator, a first signal which comprises a characteristic of the echo signal; and
    providing, by a filter, an output signal from the coupler to the antenna,
    wherein the circulator is positioned between the coupler and the filter, and
    wherein the filter is positioned between the circulator and the antenna.

14. The method of claim 13, wherein the removing the echo signal further comprises:
    performing, by a first modeling unit, a first modeling on the input signal so as to output a same signal as the first signal; and
    providing, by a first adder, a difference between an output signal from the first modeling unit and the first signal to the first modeling unit.

15. The method of claim 14, wherein the removing the echo signal further comprises:

delaying, by a delayer, the output signal from the first modeling unit by a delay value, wherein the delay value is determined by a correlation between a second signal indicating a difference between the feedback signal and the input signal, and the output signal from the first modeling unit.

16. The method of claim 15, wherein the removing the echo signal further comprises:

performing, by a second modeling unit, a second modeling on the delayed output signal so as to output a same signal as the second signal; and providing, by a second adder, a difference between an output signal from the second modeling unit and the second signal to the second modeling unit.

17. The method of claim 16, wherein the removing the echo signal further comprises:

providing, by a third adder, the second signal indicating the difference between the feedback signal and the input signal to the second adder.

18. The method of claim 17, wherein the removing the echo signal further comprises:

providing, by a fourth adder, a third signal indicating the difference between the feedback signal and the output signal from the second modeling unit to the digital pre-distortion adaptation unit, wherein the third signal is a signal with the echo signal cancelled from the feedback signal.

* * * * *